United States Patent [19]

Farwell

[11] Patent Number: 5,488,309
[45] Date of Patent: Jan. 30, 1996

[54] METHOD OF TESTING THE OUTPUT PROPAGATION DELAY OF DIGITAL DEVICES

[75] Inventor: William D. Farwell, Thousand Oaks, Calif.

[73] Assignee: Hughes Aircraft Company, Los Angeles, Calif.

[21] Appl. No.: 143,957

[22] Filed: Nov. 1, 1993

[51] Int. Cl.⁶ .................................................. G01R 15/12
[52] U.S. Cl. ......................... 324/617; 371/25.1; 371/62
[58] Field of Search .................................. 324/73.1, 601, 324/617; 307/590, 591, 602, 603; 371/22.3, 25.1, 62

[56] References Cited

U.S. PATENT DOCUMENTS

| 4,146,835 | 5/1979 | Chnapko et al. | 324/617 |
|---|---|---|---|
| 4,330,750 | 5/1982 | Mayor | 328/55 |
| 4,497,056 | 1/1985 | Sugamori | 371/25.1 |
| 4,712,061 | 12/1987 | Lach | 324/76.55 |
| 4,845,390 | 7/1989 | Chan | 307/591 |
| 4,876,501 | 10/1989 | Ardini et al. | 371/62 |

*Primary Examiner*—Kenneth A. Wieder
*Assistant Examiner*—Christopher M. Tobin
*Attorney, Agent, or Firm*—Leonard A. Alkov; W. K. Denson-Low

[57] ABSTRACT

A test system for testing propagation delays of outputs of integrated circuit devices. The test system includes a test circuit for applying input signals to selected inputs of the digital integrated circuit and for sampling selected outputs of the digital integrated circuit, and respective loads for each of the selected outputs, each load having an impedance that is configured such that the sum of the specified internal delay for such output and a load dependent delay for such output comprise a total propagation delay that is substantially identical for all of the selected outputs, whereby all of the selected outputs are sampled simultaneously.

3 Claims, 2 Drawing Sheets

METHOD OF TESTING THE OUTPUT PROPAGATION DELAY OF DIGITAL DEVICES

BACKGROUND OF THE INVENTION

The disclosed invention is directed generally to testing system for performing output propagation delay testing of digital integrated circuits, and more particularly to a test system for testing all output propagation delays concurrently.

A digital integrated circuit is typically designed such that each output is specified to have a worst case propagation delay relative to one or more predetermined inputs. More particularly, the response of each output is characterized relative to logic level transitions of one or more inputs for different logic level transitions at the output. The specified worst case propagation delays for different outputs will typically be different from each other.

Propagation delay testing is commonly performed with automatic test equipment which (1) applies input signals, (2) strobes the outputs to sample the output values, and (3) compares the sampled output values with expected values. Since the number of different strobes (i.e., strobes that occur at different times) that can be provided will typically be less than the number of different output propagation delays of a digital integrated circuit having a large number of outputs, many outputs cannot be accurately tested since many outputs are strobed after their specified worst case propagation times.

SUMMARY OF THE INVENTION

It would therefore be an advantage to provide for a test system that enables all output propagation delays of a digital integrated circuit to be tested concurrently (i.e., sampled at a single, common strobe time) without sacrificing accuracy.

The foregoing and other advantages are provided by the invention in a test system that includes a test circuit for applying input signals to selected inputs of the digital integrated circuit and for sampling selected outputs of the digital integrated circuit, and respective loads for each of the selected outputs, each load having an impedance that is configured such that the sum of the specified internal delay for such output and a load dependent delay for such output comprise a total propagation delay that is substantially identical for all of the selected outputs, whereby all of the selected outputs are sampled simultaneously.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
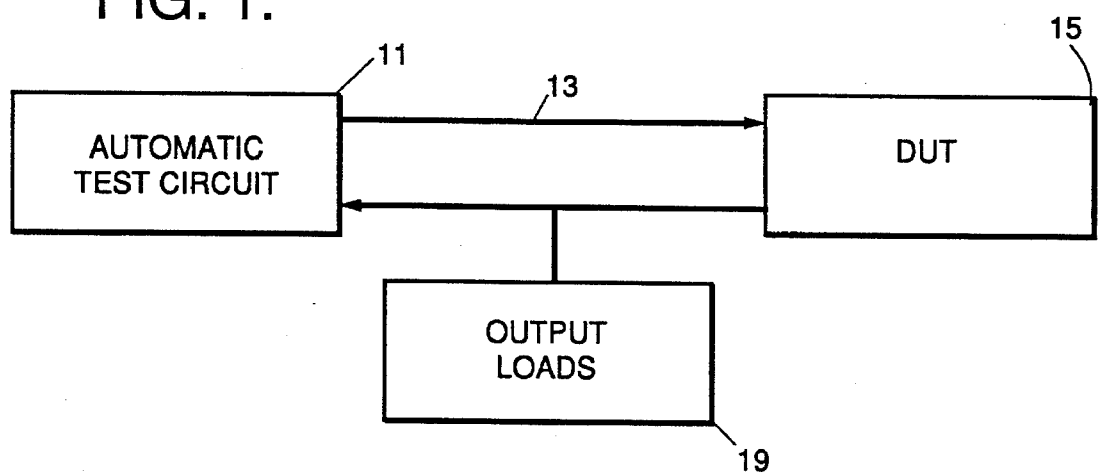
FIG. 1 is a block diagram of a test system in accordance with the invention.

In the following detailed description and in the several figures of the drawing, like elements are identified with like reference numerals.

Referring now to FIG. 1, set forth therein is a simplified block diagram of a propagation delay test system in accordance with the invention. An automatic test circuit 11 provides M test signals to device input interconnect lines 13 which are connected to inputs of an integrated circuit device under test (DUT) 15 that is being tested in accordance with the invention, such that the test signals provided by the automatic test circuit 11 comprise inputs to the DUT 15. The automatic test circuit 11 further receives a plurality of inputs from device output interconnect lines 17 which are connected to outputs of the DUT 15, such that the outputs of the integrated DUT 15 comprise inputs to the automatic test circuit 11. Respective unique loads 19 are respectively connected between each of the device output interconnect lines 17 and ground. Each of the unique passive loads 19 comprises a passive impedance applied to a respective output of the DUT 15.

In accordance with the invention, each of the unique test loads 19 is adjusted to introduce a controllable test load delay to the signal produced by the output to which the load is connected, and the controllable test load delay $T_{TL}$ for each output is selected such that the sum of (a) the specified worst case internal delay $T_I$ for an output and (b) the controllable test load delay $T_{TL}$ for such output is equal to a test propagation delay $T_T$ that is the same for all outputs.

The internal delay $T_I$ for an output is defined as the time interval between the transition of a pertinent device input and the start of a related output transition, and is independent of the external load impedance on the output.

The test load delay $T_{TL}$ is defined as the delay of the output driver of the integrated circuit output in driving the test load, starting with the start of the transition of the output signal and ending when the output signal reaches a specified logic level threshold. This delay is dependent on the output buffer and the magnitude of the test load impedance.

The test propagation delay $T_T$ is at least as great as the total propagation delay of the slowest DUT output in the test environment, wherein the total propagation delay of a given DUT output is the sum of (a) the specified worst case internal delay $T_I$ for the output and (b) the specified worst case load delay $T_L$ caused by the minimum load provided by the test environment. In other words, the test propagation delay $T_T$ is selected pursuant to the following condition:

$$T_T > MAX(T_I + T_L) \qquad (Equation\ 1)$$

wherein $MAX(T_I+T_L)$ denotes the longest total propagation delay of all the outputs in the test environment. In particular, the longest total delay in the test environment is longest delay that would be observed if all outputs drove the minimum load that the automatic test circuit provides, and can be determined empirically or by computer simulation, for example.

After the test propagation delay $T_T$ is determined, the impedance of the test load for each output of the DUT is selected to meet the following condition:

$$TTL = T_T - T_I \qquad \text{(Equation 2)}$$

which follows from the earlier stated condition that for each of the outputs the sum of the specified internal delay $T_I$ for a given output and the controllable test load delay $T_{TL}$ for such output is equal to the test propagation delay $T_T$ which is the same for all outputs. For example, the condition of Equation 2 can achieved by increasing the loads of all outputs other than an output having the longest delay to be greater than the minimum load for which the longest propagation delay was determined. By selecting the test propagation delay $T_T$ in accordance with Equation 1, both the drive current capabilities of the output buffers and the internal delays of the DUT will be tested.

Figure 2:
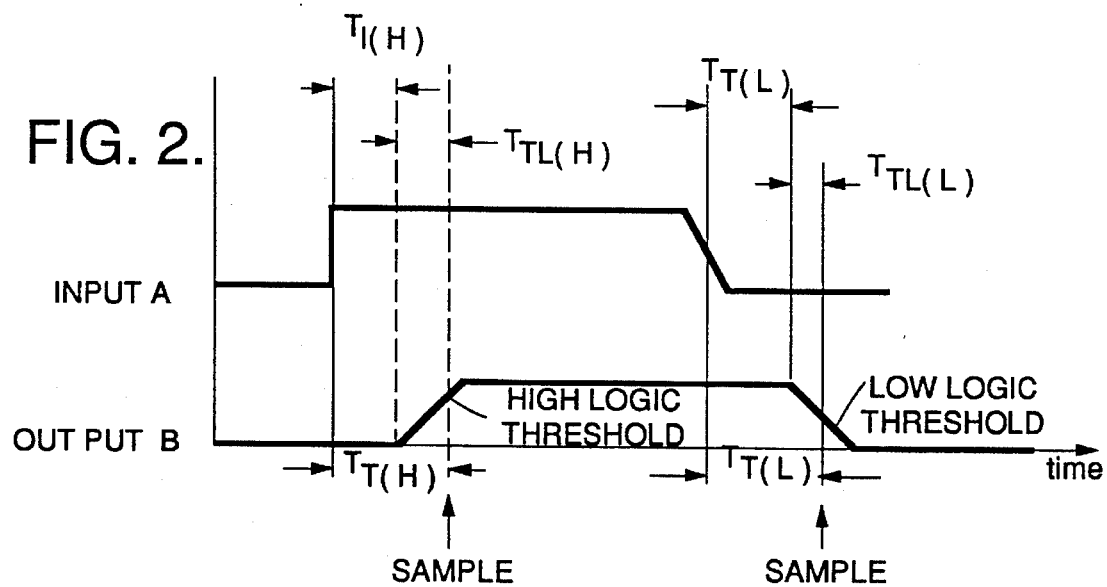
FIG. 2 is a timing diagram illustrating the timing of output propagation delay testing in accordance with the invention.

Referring now to FIG. 2, schematically depicted therein is a timing diagram illustrating the timing parameters tested by the test set up of FIG. 1 for an input A of the DUT 15 and a device output B for the illustrative example wherein the output B is configured to replicate the logic level of the signal applied to the input A. As shown in FIG. 2, the automatic test circuit 11 samples the output B at particular SAMPLE instants that are delayed relative to transitions of the signal applied to the input A by test propagation delays $T_{T(H)}$ and $T_{T(L)}$, wherein $T_{T(H)}$ is the test propagation delay between (a) the occurrence of the positive going transition of the signal at the input A and (b) the subsequent sampling of the output B which is expected to transition to high, and wherein $T_{T(L)}$ is the test propagation delay interval between (a) the occurrence of the negative going transition of the signal at the input A and (b) the subsequent sampling of the output B which is expected to transition to low. Also represented in FIG. 2 are an internal delays $T_{I(H)}$ and $T_{I(L)}$, as well as test load dependent delays $T_{TL(H)}$ and $T_{TL(L)}$. The internal delay $T_{I(H)}$ is the delay for a positive going transition of the output B, and the internal delay $T_{I(L)}$ is for a negative going transition of the output B. The test load dependent delay $T_{TL(H)}$ is the test load dependent delay for a positive going transition of the output B, and the test load delay $T_{TL(L)}$ is the test load dependent delay for a negative going transition of the output B.

In accordance with the invention, the adjustable load impedance for the outputs of the DUT 15 including the output B are adjusted to control the rise time or fall time of the transitions of the outputs such that for each output the sum of (1) the specified worst case internal delay for the output and (2) the test load delay as determined by the adjustable load for the output is equal to the test propagation delay for the particular combinations of data transitions at the inputs and the expected transitions at the outputs. In particular example of the output B and the input A, the adjustable load impedance is configured such that if the internal delay of the output B is at the worst case (i.e., the longest delay that is within specification), the output signal will be at a level that corresponds to the logic threshold for the particular output transition. Such worst case situations are depicted in FIG. 2, wherein the positive going transition of the output B in response to a positive transition at the input A reaches the logic high threshold at the time of sampling, and wherein the negative going transition of the output B in response to a negative transition at the input A reaches the logic low threshold at the time of sampling. In this manner, if the internal delay of the output B is greater than the specified worst case internal delay, the output sampled will not be of the expected logic level, and the automatic test equipment will detect a test failure at the output B. If the internal delay of the output B is less than the specified worst case internal delay, the output will have risen or fallen beyond the pertinent logic threshold, and will be of the expected state.

In use, since the positive and negative transitions of an output typically have different total propagation delays, the adjustable unique loads 19 can be adjusted for each output according to the particular transition being delay tested. For example, the adjustable loads can be implemented by conventional load boards, and different load boards having different loads can be utilized for the different delay tests. The automatic test circuit 11 can comprise conventional automatic test equipment, for example.

Thus, since all of the outputs have adjustable loads that are adjusted such that Equation (2) is satisfied for all of the outputs for a given test propagation delay $T_T$, all outputs can be tested simultaneously. Generally as to the waveforms of the outputs of the DUT, since a particular test propagation delay is the same for all outputs, an output having a shorter specified worst case internal delay than the specified worst case internal delay for another output would have its adjustable load adjusted to produce a transition that is less steep than the transition for such other output. Should a particular output be slower than specification, due either to a slow internal delay or a slow test load dependent delay, the sampled logic level will be opposite the expected state when a delay test is performed, for the particular example wherein a delay test sets each output to the state opposite the expected state immediately prior to application of the input signals that cause the tested output states.

Referring now to FIGS. 3–6, set forth therein are schematic illustrations of load circuits that can be utilized in accordance with the invention with each of the device output interconnect lines 17 as depicted for a representative output interconnect line 17a.

Figure 3:
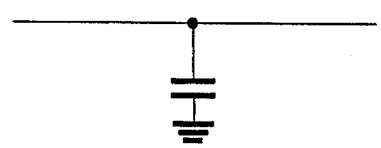
FIG. 3 schematically depicts an illustrative example of an output test load that can utilized in the test system of FIG. 1.

FIG. 3 in particular depicts a load comprised of a fixed capacitance 41 connected between the output interconnect line 17a and ground. In use, the capacitance of the fixed capacitance 41 is selected to produce a load dependent delay $T_L$ that satisfies the condition of Equation 2, for example by using different load boards for different devices, each having appropriate capacitances respectively connected to respective outputs of the DUT for respective test propagation delays.

Figure 4:
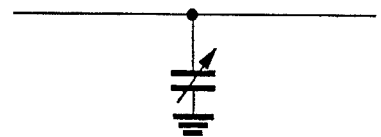
FIG. 4 schematically depicts a further illustrative example of an output test load that can utilized in the test system of FIG. 1.

FIG. 4 in particular depicts a load comprised of an adjustable capacitance 51 connected between the output interconnect line 17a and ground. In use, each adjustable capacitance 51 is adjusted to produce a load dependent delay $T_L$ that satisfies the condition of Equation 2 for the output of the DUT to which it is connected.

Figure 5:
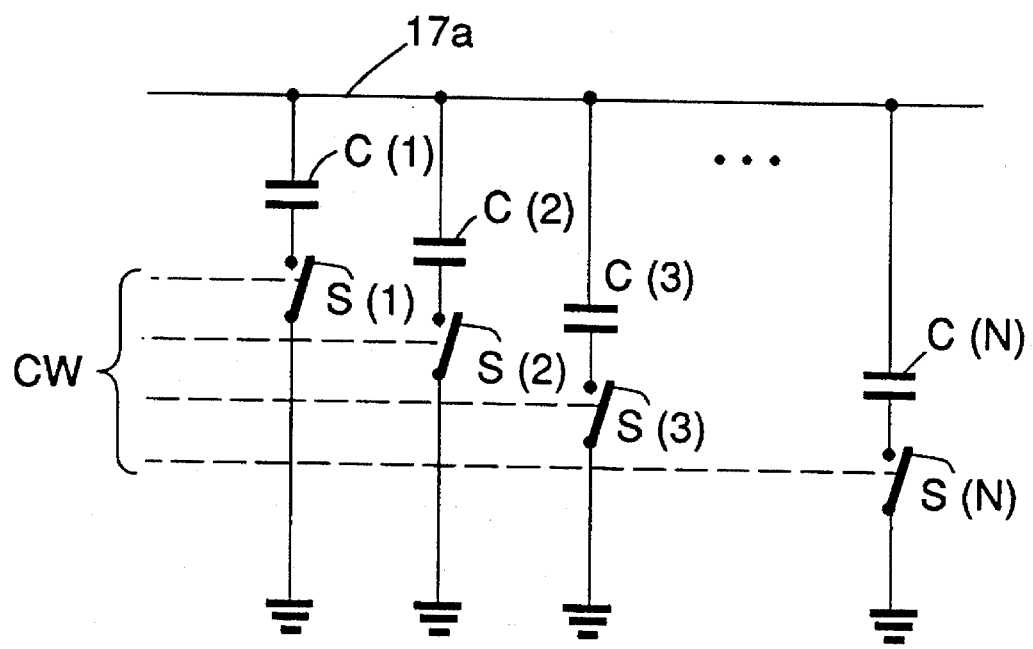
FIG. 5 schematically depicts a particular implementation of the output test load of FIG. 4.

FIG. 5 schematically depicts a particular implementation of the adjustable capacitance 51 of FIG. 4. The adjustable capacitance of FIG. 5 comprises an array of capacitors $C(1)$, $C(2)$, $C(3)$, .... $C(N)$ having binary weighted capacitances that $C, 2,C, 4,C, ... 2^{N-1}*C$, wherein C is a constant and N is the number of capacitances in the array. The capacitors are connected between the output interconnect line 17a and respective switches $S(1)$, $S(2)$, $S(3)$, ... $S(N)$ which are respectively controlled by respective bits of a binary word CW. When a switch $S(I)$ is closed, the corresponding capacitance $C(i)$ is connected between the output interconnect line 17a and ground, and therefore is included in the load. Thus, the load can be set between 0 and $2^{N-1}*C$ in increments of C. A universal load board would include a capacitor array as shown in FIG. 5 for each output that the board is capable of interconnecting.

Figure 6:
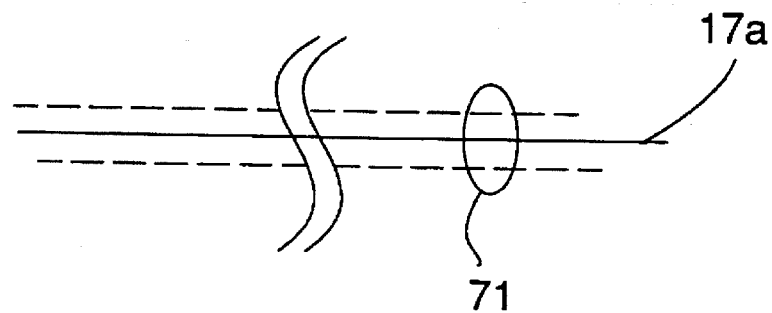
FIG. 6 schematically depicts yet another illustrative example of an output test load that can utilized in the test system of FIG. 1.

FIG. 6 depicts a load comprised of a variable length transmission line 71 that is in series with the output interconnect line 17a. In use, the length of the transmission line 71 is adjusted to produce a load dependent delay $T_L$ that satisfies the condition of Equation 2, for example by using different load boards having appropriately configured transmission line lengths for respective propagation test delays and output transitions.

The foregoing has been a disclosure of a test system that advantageously enables all output propagation delays of a digital integrated circuit to be tested concurrently without sacrificing accuracy.

Although the foregoing has been a description and illustration of specific embodiments of the invention, various modifications and changes thereto can be made by persons skilled in the art without departing from the scope and spirit of the invention as defined by the following claims.

What is claimed is:

1. A test system for testing output propagation delays of selected outputs of a digital integrated circuit having inputs and wherein each output has a specified internal propagation delay, comprising:

a test circuit for applying input signals to selected inputs of the digital integrated circuit and for sampling selected outputs of the digital integrated circuit; and respective loads for each of the selected outputs, each load having an impedance that is configured such that the sum of the specified internal delay for such output and a load dependent delay for such output comprises a total test propagation delay that is substantially identical for all of the selected outputs;

said test circuit further sampling all of the selected outputs simultaneously and comparing the sampled outputs with expected output values.

2. The test system of claim 1 wherein each of said respective loads comprises an array of switched capacitors having binarily weighted capacitances.

3. The test system of claim 1 wherein said total test propagation delay comprises the longest of total delays of all of the outputs for a given load, wherein a total delay for an output comprises the sum of the specified internal delay for such output and a load dependent delay for such output for such given load.

* * * * *